(12) United States Patent
Hansen et al.

(10) Patent No.: US 7,028,698 B2
(45) Date of Patent: Apr. 18, 2006

(54) PRESSURE PROCESSING APPARATUS WITH IMPROVED HEATING AND CLOSURE SYSTEM

(76) Inventors: Brian Nils Hansen, 401 Mountain View Ave., Longmont, CO (US) 80501; Samuel Wesley Crouch, 705 36th, Boulder, CO (US) 80303; Brooks Michael Hybertson, 4900 Fourmile Canyon Dr., Boulder, CO (US) 80302

( * ) Notice: Subject to any disclaimer, the term of this patent is extended or adjusted under 35 U.S.C. 154(b) by 457 days.

(21) Appl. No.: 10/329,171

(22) Filed: Dec. 24, 2002

(65) Prior Publication Data

US 2004/0118430 A1  Jun. 24, 2004

Related U.S. Application Data

(60) Provisional application No. 60/342,861, filed on Dec. 28, 2001.

(51) Int. Cl.
*B08B 3/00* (2006.01)
(52) U.S. Cl. .................. 134/147; 134/56 R; 134/94.1; 134/104.2; 134/105; 134/107; 134/133; 134/137; 134/142; 134/184; 134/200; 134/902
(58) Field of Classification Search .............. 134/56 R, 134/113, 105, 200, 18, 902, 94.1, 104.2, 107, 134/133, 137, 142, 147, 184
See application file for complete search history.

(56) References Cited

U.S. PATENT DOCUMENTS

| 5,217,501 | A | * | 6/1993 | Fuse et al. ................. 29/25.01 |
| 5,482,564 | A | * | 1/1996 | Douglas et al. ............... 134/18 |
| 5,818,578 | A | * | 10/1998 | Inman et al. ............... 356/246 |
| 5,979,306 | A | * | 11/1999 | Fujikawa et al. ............. 100/90 |
| 6,048,494 | A | * | 4/2000 | Annapragada ............... 422/33 |
| 6,067,728 | A | * | 5/2000 | Farmer et al. ................ 34/470 |
| 6,497,239 | B1 | * | 12/2002 | Farmer et al. ............ 134/56 R |
| 6,508,259 | B1 | * | 1/2003 | Tseronis et al. ............ 134/105 |
| 6,612,317 | B1 | * | 9/2003 | Costantini et al. ........ 134/58 R |

* cited by examiner

*Primary Examiner*—M. Komakov

(57) ABSTRACT

Apparatus for pressure processing components is disclosed which includes an improved closure system that minimizes dust-generating parts and allows easy access to the chamber. Ports are provided for introducing and releasing pressurized gases and fluids to and from the processing space. The heating system of the apparatus heats both the cover and the stage inside the pressurized chamber such that cycle time to equilibrate heated, pressurized fluids such as supercritical carbon dioxide inside the chamber are decreased. The apparatus includes a mechanism that raises the stage inside the chamber, pressing it against the fixed cover and sealing the inside of the pressure vessel. In one embodiment a screw-type jack is used to move the component-loaded stage fitted with a deformable o-ring seal a short travel distance to seat against the lid and seal the pressure chamber. In a related embodiment a computer and an electronic stepper motor are used to drive the pressing means in an automated fashion.

15 Claims, 3 Drawing Sheets

PRESSURE PROCESSING APPARATUS WITH IMPROVED HEATING AND CLOSURE SYSTEM

CROSS-REFERENCE TO RELATED APPLICATIONS

Figure 1:
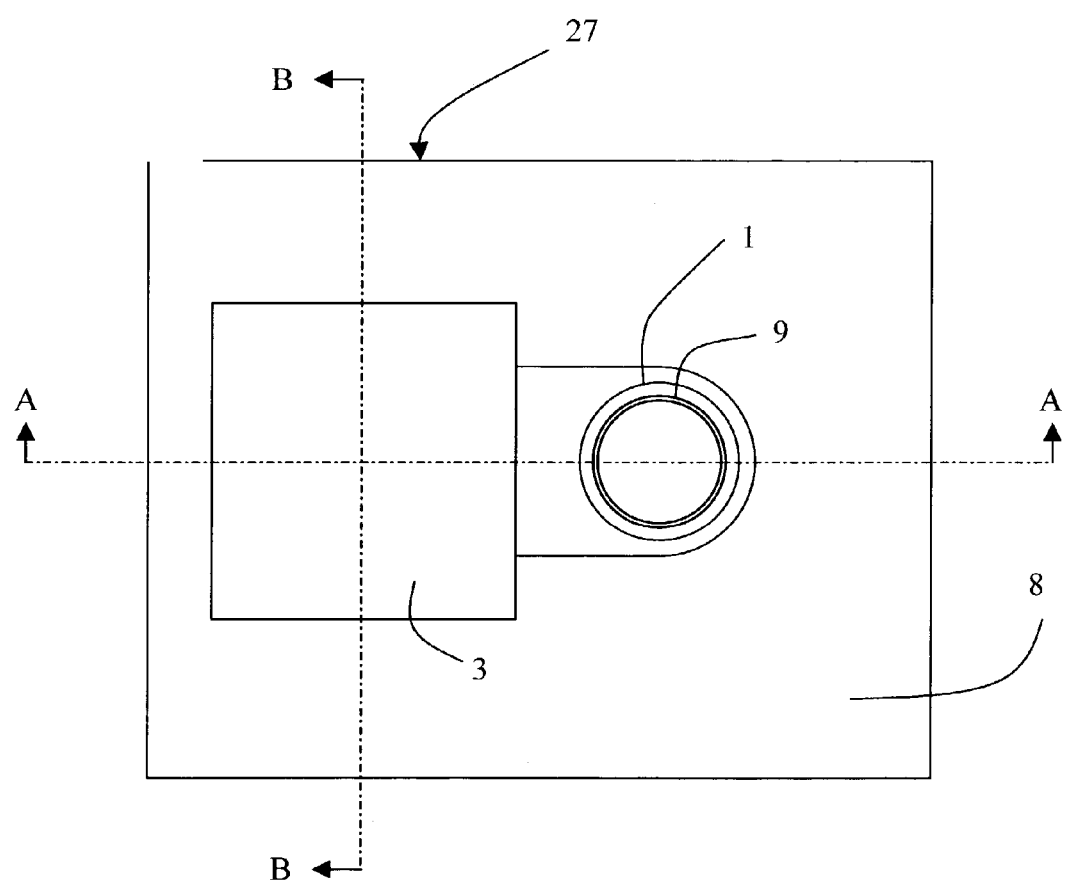

This application is entitled to the benefit of Provisional Patent Application No. 60/342,861 filed Dec. 28, 2001 by Hybertson, et al.

STATEMENT REGARDING FEDERALLY SPONSORED RESEARCH AND DEVELOPMENT

Not applicable.

BACKGROUND

1. Field of Invention

This invention relates to an apparatus for pressure processes for coating, stripping, cleaning, and/or drying workpieces using gases, liquids, and/or supercritical fluids, collectively referred to hereafter as "fluids," preferably that minimize surface tension effects. More particularly, it relates to an apparatus for processing workpieces comprising integrated circuits (IC) or microelectromechanical structures (MEMS) on wafer-like substrates such as Si wafers.

2. Description of Prior Art

In the manufacture of integrated circuit (IC) and microelectromechanical structure (MEMS) devices and other high-value components, treatment of workpieces with heated and pressurized gases and supercritical fluids have been shown by others to be advantageous in several of the processing steps.

The production of integrated circuits with very fine, high-density circuit patterns, for example with pattern widths of less than 100 nm, is hindered by the difficulty of wetting the surfaces of the features during production and wash steps. Furthermore, surface tension and related capillary effects can cause pattern collapse during the drying of very fine IC devices. After processing such an IC and washing it with water, the capillary forces that occur on the IC surface during drying can crush the fine features on the surface (Purtell, 1998). A related problem caused by surface tension effects has long been recognized in the production of MEMS devices (Jafri, Moritz, Busta, & Walsh, 1999; Maboudian & Howe, 1997; Mulhern, Soane, & Howe, 1993).

MEMS, sometimes referred to as micromachines, are tiny devices that are manufactured in bulk, typically through masking and etching processes on the surface of silicon wafers. One crucial step in their production is cleaning and drying them after fabrication processing but before packaging. Water-based cleaning procedures work well until the MEMS are dried. As the water evaporates during the drying process, its high surface tension causes it to pull at the delicate features, breaking them or sticking them to the surface (the so-called "stiction" problem). MEMS manufacturers have turned to several manufacturing solutions including the use of supercritical carbon dioxide dryers to prevent the productivity losses caused by stiction.

To make it supercritical, carbon dioxide gas is heated from room temperature to above its critical point (31° C. or 88° F.) and pressurized to above its critical pressure (73 atmospheres or 1073 psi). Under these conditions, carbon dioxide is a supercritical fluid with liquid-like density and solvent power, but with gas-like diffusibility. For the purposes of MEMS drying, the salient features of supercritical carbon dioxide include its zero surface tension and its ability to dissolve away alcohols and organic contaminants from the surface of the device.

In a typical supercritical carbon dioxide drying method, the MEMS workpiece is processed by usual and customary methods up to and including a final wash with water. Following the wash step, however, it is not dried. It is, instead, immersed in methanol to displace the water. Still wet with methanol, the MEMS workpiece is placed inside a pressurizable chamber which is then filled with supercritical carbon dioxide. The methanol is solvated by the carbon dioxide fluid and dissolved away from the workpiece surface, then the chamber is depressurized, forming gas phase carbon dioxide and leaving a clean, dry MEMS surface.

Due to the near-zero surface tension of the fluid, supercritical carbon dioxide processing method for drying ultrafine IC or MEMS devices is gentler on the surface features than other (wet) methods, potentially lowering the failure rate of manufactured devices (Jafri et al., 1999).

Extending the early work by Mulhern, et al., that described the process of drying MEMS devices using supercritical carbon dioxide (Mulhern et al., 1993), U.S. Pat. No. 5,482,564 issued to Douglas and Wallace teaches a method in which supercritical fluid mixtures can be used to unstick MEMS components.

U.S. Pat. No. 6,048,494 issued to Annapragada discloses a pressure chamber, referred to therein as an autoclave, with a moving cassette inside the pressure chamber and with a movable door inside the chamber that is used to seal the opening through which the chamber is accessed and allow its pressurization.

U.S. Pat. No. 6,067,728 issued to Farmer, et al., discloses a system for drying a microelectronic structure on a wafer substrate using the supercritical fluid method and a chamber with a hinged top and cam plate and roller system to lock the hinged top onto the pressure chamber.

U.S. Pat. No. 5,979,306 issued to Fujikawa, et al., discloses an apparatus for heating and processing a workpiece under high-pressure comprising a vessel which is pressed closed in the axial direction to seal the workpiece within the vessel. The vessel has a sealing means mounted into the lower portion of the vessel to allow formation of a pressurizable processing space, a ram to press the lower portion of the vessel against the upper part of the vessel, and a window frame form to hold the components.

As is evident from the related prior art, processing of IC and MEMS wafers, as well as other high-value workpieces, in heated, pressurized chambers can be used for a variety of fabrication, cleaning, and drying procedures. The previously disclosed pressure chambers used for such processing, however, have moving parts and components that can shed particulates and release them into the apparatus itself and into the room in which the device is located during operation of the apparatus and/or during replacement of internal parts such as the sealing means. The problem with such particulates is that that they lead to higher failure rates of processed workpieces.

Existing devices for processing workpieces under gases or fluids under temperature and pressure control have significant operational and/or maintenance problems with respect to particulate generation and workpiece and/or workroom contamination.

BACKGROUND—OBJECTS AND ADVANTAGES

It is an object of the invention to provide an apparatus for processing an integrated circuit or microelectromechanical system on a wafer substrate, or other high-value workpiece, comprising a pressure vessel with a fixed top, a removable stage for loading the workpiece or workpieces onto, a piston to press the loaded stage against the fixed top, a sealing means in the removable stage to form a seal upon compression, and means for introducing pressurized processing fluids and heating said fluids and workpiece(s).

The apparatus would include a means to position the removable stage correctly upon the piston.

It is a further object to provide a simple means for replacing the sealing means when indicated. The removable stage would include a sealing means such as a plastic, elastic, or metallic o-ring, which would be accessible for removal and replacement when the stage is removed from the apparatus.

From the detailed description and diagrams herein, a number of advantages of the present invention are evident:

(a) The pressure chamber design decreases particulate contamination production during both operational and maintenance procedures, facilitating installation of the invention within clean room environments and allowing decreased workpiece failure rates. Because it is simply a part of the removable stage, the primary maintenance item of the pressure chamber apparatus, the sealing means (such as a plastic, elastic, or metallic o-ring), can be easily and cleanly replaced without opening or dismantling any additional parts of the apparatus and without moving the bulk of the apparatus out of the clean room environment.

(b) Because the chamber top is fixed and heated, the cycle time for cleaning and/or drying a workpiece is much shorter than if the cover were removable and unheated. The heated chamber top (3) facilitates thermal equilibration of the processing gas or fluid within the chamber.

(c) The simple side opening on the pressure chamber will facilitate automation of the workpiece handling process if desired. The stage that holds the workpiece simply slides into the opening on the side of the apparatus and is pressed into place against the fixed lid, sealing a pressurizable chamber by compressing the o-ring sealing means.

(d) The apparatus has only a small number of moving parts, and except for the top of the push plate (4), they are all contained within the housing (10). This minimizes the production and release of harmful particulates.

SUMMARY

In order to solve the problems described above, an object of the present invention is to allow clean operation and maintenance of the apparatus for processing workpieces with a gas or fluid under temperature and pressure control using a chamber which has two portions, one of which is removable and acts as a stage on which workpieces can be mounted and which has the sealing means attached to it, allowing easy and clean replacement of the sealing means, said chamber being closed by pressing the two portions together. Further, the moving parts of the pressing means are contained within a housing. Another object of the present invention is to facilitate rapid operation for processing workpieces by maintaining the top and bottom of the chamber at chosen temperature and by preheating the fluid prior to its entrance into the chamber. In short, the present invention offers significant and novel advantages in its design and operation largely related to its cleanliness, temperature control, and ease of loading and unloading.

DRAWINGS—FIGURES

FIG. 1 is a top elevation of a preferred embodiment of the pressure processing apparatus (27), showing the stage (1), the o-ring sealing means (9), the chamber top (3), and the table top (8).

Figure 2:
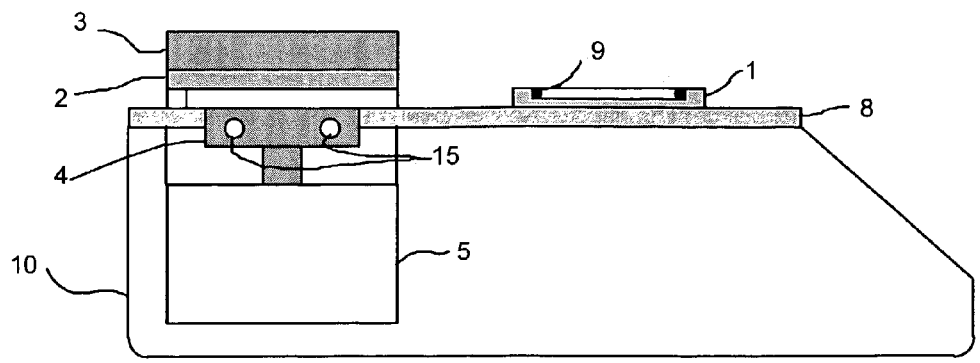

FIG. 2 is a left side cross-sectional view of a preferred embodiment of the pressure processing apparatus of FIG. 1, cut through the center of the pressure chamber as marked in FIG. 1 by line A with arrows marking the sight direction, showing the moveable stage (1) positioned outside of the chamber opening, the chamber lid (2), the chamber top (3), the push plate (4), the pressing means (5), the table top (8), the sealing means (9), the housing (10), and the bottom zone heaters (15).

Figure 3:
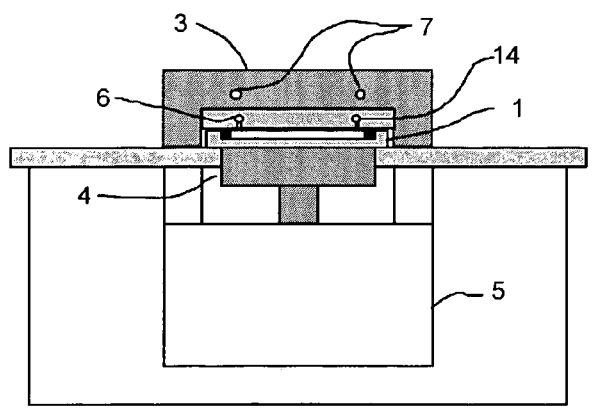

FIG. 3 is a front, cross-sectional view of a preferred embodiment of the pressure processing apparatus of FIG. 1, cut through the center of the pressure chamber as marked in FIG. 1 by line B with arrows marking the sight direction, showing the stage (1) in the down position, the sealing means (9), the chamber top (3), the heaters (7) in the chamber top, the high pressure inlet (6), the push plate (4), the pressing means (5), and the high pressure outlet (14).

Figure 4:
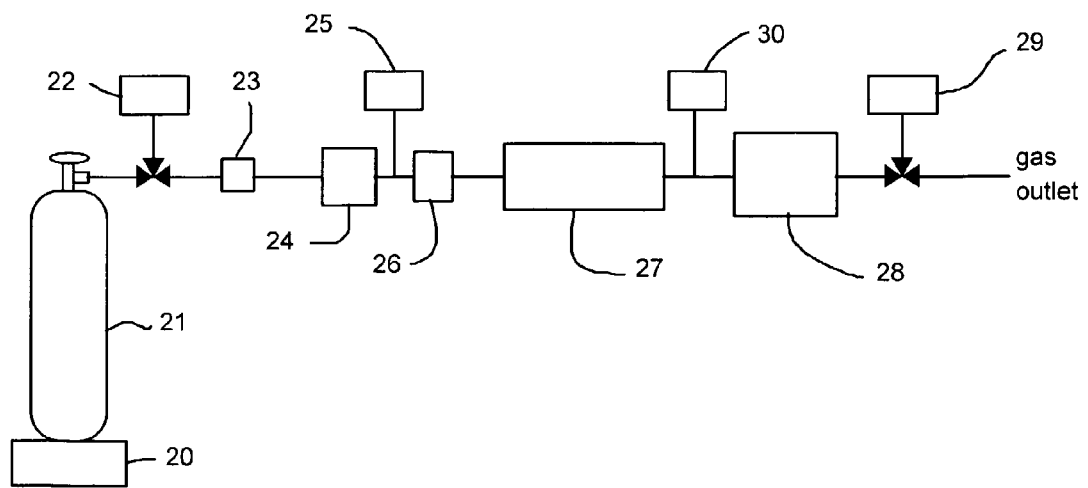

FIG. 4 is a schematic of a preferred embodiment of the pressure processing apparatus along with external components used during its operation, showing a carbon dioxide tank (21) setting on a weight sensor or other means to measure the amount of carbon dioxide in said tank (20), an inlet valve and controller (22), a manifold along with standard means to deliver pressurized liquid organic solvents and water or other aqueous solutions (23), a particulate filter (24), a rupture disk (25), a heat exchanger (26), the pressure chamber assembly (27), a detector (28), an outlet valve and controller (29), and a pressure sensor (30).

Figure 5:
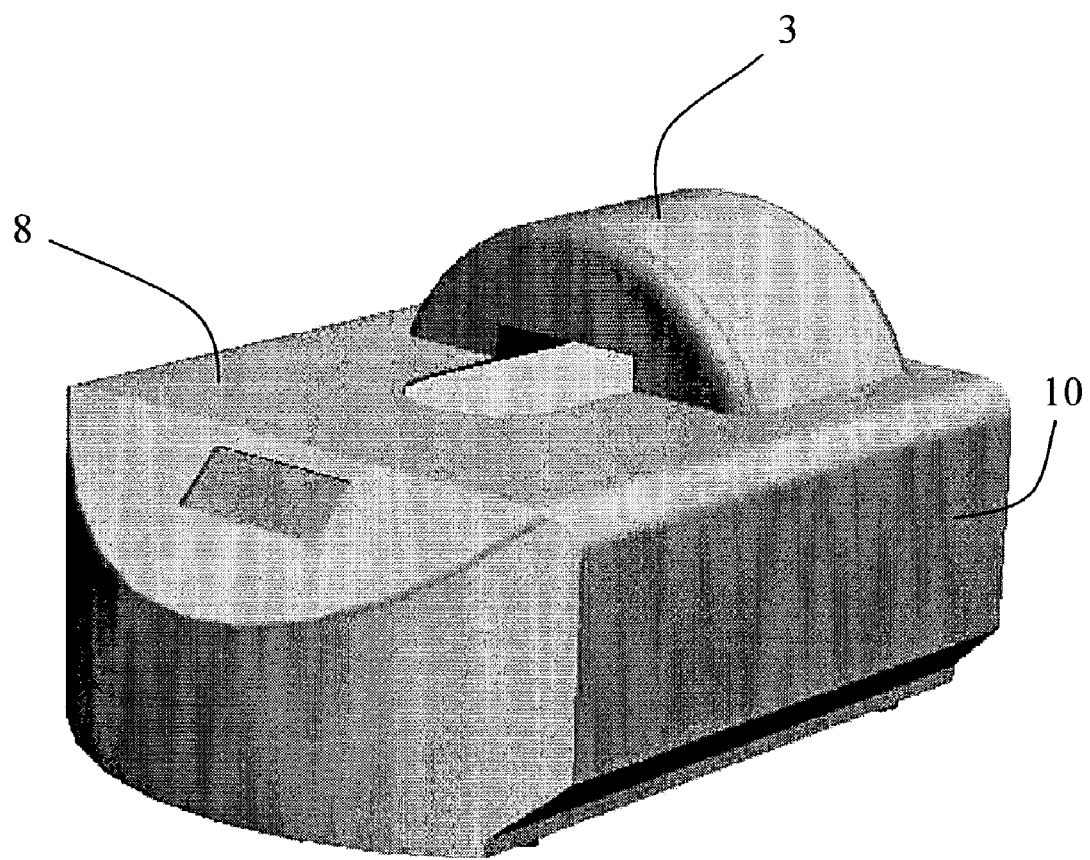

FIG. 5 is an aerial solid view above the top, right side of a preferred embodiment of the pressure processing apparatus, showing the chamber opening under the chamber top (3), the table top (8), the housing (10), and a control panel on the front.

DRAWINGS—REFERENCE NUMERALS

| | |
|---|---|
| 1 | Stage |
| 2 | Chamber lid |
| 3 | Chamber top |
| 4 | Push plate |
| 5 | Pressing means |
| 6 | Fluid inlet |
| 7 | Top zone heater |
| 8 | Table top |
| 9 | Sealing o-ring |
| 10 | Housing |
| 14 | High pressure outlet |
| 15 | Bottom zone heaters |
| 20 | Tank weight sensor |
| 21 | Carbon dioxide tank |
| 22 | Inlet valve and controller |
| 23 | Manifold for introducing liquids |
| 24 | Particulate filter |
| 25 | Rupture disk |

-continued

| | |
|---|---|
| 26 | Heat exchanger |
| 27 | Pressure chamber assembly |
| 28 | Detector |
| 29 | Outlet valve and controller |
| 30 | Pressure sensor |

DETAILED DESCRIPTION—PREFERRED EMBODIMENT

A preferred embodiment of the invention is depicted in FIGS. 1–5 and will be described below in reference to the Figures. To facilitate clarity in the description of crucial aspects of the invention, well-known components, circuits, manifolds, and procedures are not described in detail. The invention can, of course, take the form of additional embodiments, so the preferred embodiment that is described is intended to describe and teach the invention without limiting the specific details of the invention. For example, the invention can be oriented so that the chamber opens and closes in a horizontal instead of vertical direction. One of ordinary skill in the art will be able to envision and practice the invention as described or in related, alternative embodiments.

The present invention includes a removable stage 1 upon which are positioned one or more workpieces to be processed. The stage 1 is moved in the axial direction of the chamber by the push plate 4, which is driven by the pressing means 5. The push plate 4 and pressing means 5 are contained within the housing 10 to facilitate clean operation of the apparatus. When pressed into the closed position, the sealing means 9 is compressed between the stage 1 and the chamber lid 2 in such a manner as to form a pressurizable chamber. The chamber lid 2 is held in position by the chamber top 3. One skilled in the art will appreciate that the height of the chamber can be changed.

The present invention provides inlet 6 and outlet 14 ports for processing fluids to enter and exit the chamber, and a pressure sensor 30 to measure pressure within the chamber. On the inlet side, prior to the chamber inlet, a heat exchanger 26 can be provided to control the temperature of the processing fluid prior to its introduction into the chamber, a particulate filter 24 can be provided to scrub the processing fluid(s) prior to entry into the chamber, and a rupture disk 25 can be provided as a safety device to prevent overpressurization of the processing chamber assembly 27, if desired.

The present invention provides heaters 15 in the bottom zone and heaters 7 in the top zone of the apparatus. The bottom zone heaters control the temperature of the push plate 4, stage 1, and table top 8.

The sealing means 9 is provided in the removable stage in such a manner as to be easily and cleanly replaceable during routine operation of the apparatus, without the need for dismantling any part of the chamber. This novel feature of the present invention is advantageous because it is conducive to clean room operation and routine maintenance—deformable seals require occasional replacement. The prior art teaches that o-ring seals can be used to seal two chamber halves pressed together. All prior inventions, however, have the significant problem that replacement of the chamber seals—which can be a frequent maintenance activity due to the temperatures and pressure used, as well as to the solvating properties of the supercritical fluids used—is not as clean as it is in the present invention. Changing the chamber seals in the processing equipment taught in prior art requires partial dismantling of the apparatus, which can release dirt and/or other harmful particulates that can contaminate the inside of the apparatus and thereby contaminate the workpieces subsequently processed in the instrument, and/or can contaminate the local environment, an undesirable occurrence in a clean room. The present invention solves this problem.

The pressing means 5 for pressing the push plate 4 that drives the stage 1 is depicted schematically in the drawings. One of ordinary skill in the art will appreciate that the pressing means utilized in the present invention could comprise many well-known devices including, but not limited to, a jack screw or a hydraulically-driven lift.

DETAILED DESCRIPTION—ADDITIONAL EMBODIMENT

An additional embodiment of the invention alters the removable stage 1 so that it consists of two parts, a base with an o-ring sealing means and a cylindrical portion with an o-ring sealing means on top. Said cylindrical portion seals against the sealing means of the base and against the chamber lid 2 when placed onto the push plate 4 and pressed to form a pressurizable chamber as above. This additional embodiment facilitates processing of taller workpieces by placing them on a stage which can be separated into two parts. That is, the tall workpiece can be placed onto the bottom part of the stage, then the cylindrical part of the stage placed over the workpiece and into contact with the o-ring sealing means on the bottom part of the stage, then the unit placed into position in the apparatus to form a chamber when pressed as above.

DETAILED DESCRIPTION—OPERATION

The present invention is ideally suited for processing integrated circuit devices and microelectromechanical systems on wafer substrates. Skilled practitioners will appreciate that relevant processing steps on such workpieces using the present invention include, but are not limited to, supercritical fluid-based procedures for cleaning, stripping, and/or drying the workpieces.

In general operation, one or more workpieces are placed onto the stage 1 (FIGS. 1–3), then the loaded stage is pushed along the tabletop 8 into an opening in the side of the chamber and onto the push plate 4. The workpiece(s) may be immobilized on the surface of the stage by use of clips, arms, weights, or other methods well-known to those skilled in the field. The pressing means 5 is engaged to raise the push plate 4 until the sealing means o-ring 9 is compressed against the surface of the chamber lid 2, forming a seal and creating a pressurizable chamber containing the workpiece.

The present invention can be utilized for several different workpiece processing steps, including cleaning and drying, depending on the desired outcome.

In one preferred mode of operation, the workpiece is processed in a usual manner, ending in a water wash step. Next the workpiece is washed with a solvent such as methanol to displace the water. Next the workpiece is loaded onto the stage 1 and they are loaded while wet into the apparatus. As described above, the loaded stage is pushed along the tabletop 8 into an opening in the side of the chamber and onto the push plate 4. The pressing means 5 is engaged to raise the push plate 4 until the sealing means o-ring 9 is compressed against the surface of the chamber lid 2, forming a seal and creating a pressurizable chamber containing the workpiece. The chamber at this point is at temperature 1 (21° C.) and room pressure (14 psia). Next carbon dioxide ($CO_2$) is preheated by passing it through a heat exchanger and is then introduced into the chamber through the high pressure inlet 6 to 1600 psig and exits the chamber through the high pressure outlet 14 at a low flow rate controlled by a valve 29 downstream of the outlet 14. This sweep of pressurized, liquid $CO_2$ is used to solubilize the methanol and carry it away from the workpiece. Next the chamber temperature is raised to 35° C. using the heaters 7 in the chamber top 3 and the heaters 15 in the push plate 4 to make the $CO_2$ supercritical so that the chamber pressure can be released without crossing the liquid/gas phase boundary. Next the inlet valve 22 upstream of the high pressure inlet 6 is closed to allow the chamber to slowly depressurize through the high pressure outlet 14 and through the outlet valve 29. This release depressurizes the $CO_2$ going from supercritical fluid phase to gas phase without liquid formation and without surface tension. Next the pressing means 5 is reversed to lower the push plate 4 and stage 1 back down to the loading position. The stage 1 is pulled out by its handle and the clean, dry workpiece is removed.

In a second preferred mode of operation, the workpiece is processed in a usual manner, ending in a water wash step. Next the workpiece is loaded onto the stage 1 and they are loaded while wet with water into the apparatus. As described above, the loaded stage is pushed along the tabletop 8 into an opening in the side of the chamber and onto the push plate 4. The pressing means 5 is engaged to raise the push plate 4 until the sealing means o-ring 9 is compressed against the surface of the chamber lid 2, forming a seal and creating a pressurizable chamber containing the workpiece. The chamber is constantly maintained above the critical temperature of carbon dioxide ($CO_2$) at 32° C. using the heaters 7 in the chamber top 3 and the heaters 15 in the push plate 4. At this point the chamber pressure is at room pressure (14 psia). Next the chamber is flushed with a solvent such as methanol through the high pressure inlet 6 to displace the water from the workpiece. Next, $CO_2$ is preheated in a heat exchanger and then introduced into the chamber through the high pressure inlet 6 to pressurize the chamber to 1600 psig and exit the chamber through the high pressure outlet 14 at a low flow rate controlled by a valve 29 downstream of the outlet 14. This sweep of pressurized, supercritical $CO_2$ is used to solubilize the methanol and carry it away from the workpiece. Next the inlet valve 22 upstream of the high pressure inlet 6 is closed to allow the chamber to slowly depressurize through the high pressure outlet 14 and through the outlet valve 29. This release depressurizes the $CO_2$ going from supercritical fluid phase to gas phase without liquid formation and without surface tension. Next the pressing means 5 is reversed to lower the push plate 4 and stage 1 back down to the loading position. The stage 1 is pulled out by its handle and the clean, dry workpiece is removed.

In a third preferred mode of operation, the workpiece is processed in a usual manner, ending in a water wash step. Next the workpiece is loaded onto the stage 1 and they are loaded while wet with water into the apparatus. As described above, the loaded stage is pushed along the tabletop 8 into an opening in the side of the chamber and onto the push plate 4. The pressing means 5 is engaged to raise the push plate 4 until the sealing means o-ring 9 is compressed against the surface of the chamber lid 2, forming a seal and creating a pressurizable chamber containing the workpiece. The chamber at this point is at temperature 1 (21° C.) and room pressure (14 psia). Next carbon dioxide ($CO_2$) is preheated by passing it through a heat exchanger and is then introduced into the chamber through the high pressure inlet 6 to 1600 psig and exits the chamber through the high pressure outlet 14 at a low flow rate controlled by a valve 29 downstream of the outlet 14. This sweep of supercritical $CO_2$ is used to solubilize the water and carry it away from the workpiece. The chamber temperature is maintained at 35° C. throughout the process using the heaters 7 in the chamber top 3 and the heaters 15 in the push plate 4 to maintain the $CO_2$ in the supercritical state so that the chamber pressure can be released without crossing the liquid/gas phase boundary. Next the inlet valve 22 upstream of the high pressure inlet 6 is closed to allow the chamber to slowly depressurize through the high pressure outlet 14 and through the outlet valve 29. This release depressurizes the $CO_2$ going from supercritical fluid phase to gas phase without liquid formation and without surface tension. Next the pressing means 5 is reversed to lower the push plate 4 and stage 1 back down to the loading position. The stage 1 is pulled out by its handle and the clean, dry workpiece is removed.

In a fourth preferred mode of operation, the workpiece is cleaned within the chamber. The workpiece to be cleaned is loaded onto the stage 1 and they are loaded into the apparatus. As described above, the loaded stage is pushed along the tabletop 8 into an opening in the side of the chamber and onto the push plate 4. The pressing means 5 is engaged to raise the push plate 4 until the sealing means o-ring 9 is compressed against the surface of the chamber lid, forming a seal and creating a pressurizable chamber containing the workpiece. The chamber at this point is at temperature 1 (21° C.) and room pressure (14 psia). Next carbon dioxide ($CO_2$) is preheated by passing it through a heat exchanger and is then introduced into the chamber through the high pressure inlet 6 to 1600 psig and exits the chamber through the high pressure outlet 14 at a low flow rate controlled by a valve 29 downstream of the outlet 14. This sweep of supercritical $CO_2$ is used to dissolve substances from the surface of the workpiece and carry it away from the workpiece. The chamber temperature is maintained at 35° C. throughout the process using the heaters 7 in the chamber top 3 and the heaters 15 in the push plate 4 to maintain the $CO_2$ in the supercritical state so that the chamber pressure can be released without crossing the liquid/gas phase boundary. Next the inlet valve 22 upstream of the high pressure inlet 6 is closed to allow the chamber to slowly depressurize through the high pressure outlet 14 and through the outlet valve 29. This release depressurizes the $CO_2$ going from supercritical fluid phase to gas phase without liquid formation and without surface tension. Next the pressing means 5 is reversed to lower the push plate 4 and stage 1 back down to the loading position. The stage 1 is pulled out by its handle and the cleaned workpiece is removed.

In a fifth preferred mode of operation, the workpiece is processed within the chamber in a manner in which the workpiece goes in dry and comes out dry. The workpiece to be processed is loaded onto the stage 1 and they are loaded into the apparatus. As described above, the loaded stage is pushed along the tabletop 8 into an opening in the side of the chamber and onto the push plate 4. The pressing means 5 is engaged to raise the push plate 4 until the sealing means o-ring 9 is compressed against the surface of the chamber lid, forming a seal and creating a pressurizable chamber containing the workpiece. The inside of the chamber at this point is at temperature 1 (21° C.) and room pressure (14 psia). Next carbon dioxide ($CO_2$) is preheated by passing it through a heat exchanger and is then introduced into the chamber through the high pressure inlet 6 to 1600 psig and exits the chamber through the high pressure outlet 14 at a low flow rate controlled by a valve 29 downstream of the outlet 14. The chamber temperature is maintained at 35° C. throughout the process using the heaters 7 in the chamber top 3 and the heaters 15 in the push plate 4 to maintain the $CO_2$ in the supercritical state so that the chamber pressure can be released without crossing the liquid/gas phase boundary. Next, a miscible organic solvent such as methanol is introduced into the chamber through a manifold 23 upstream of the high pressure inlet 6 and the carbon dioxide is washed out. Next, water or an aqueous solution is introduced into the chamber through the manifold 23 upstream of the high pressure inlet 6 and the organic solvent is washed out. At this point the workpiece is subjected to wet cleaning or stripping. Next, a miscible organic solvent such as methanol is introduced into the chamber through the manifold 23 upstream of the high pressure inlet 6 and the water or aqueous solution is washed out. Next, pressurized carbon dioxide is introduced into the chamber through manifold 23 upstream of the high pressure inlet 6 and the organic solvent is washed out. Next, the upstream valve 22 is closed and the chamber is allowed to slowly depressurize through the high pressure outlet 14 and through the outlet valve 29. This release depressurizes the $CO_2$ going from supercritical fluid phase to gas phase without liquid formation and without surface tension. Next the pressing means 5 is reversed to lower the push plate 4 and stage 1 back down to the loading position. The stage 1 is pulled out by its handle and the processed workpiece is removed.

An additional preferred mode of operation utilizes a detector 28, including but not limited to an infrared absorbance detector or a thermal conductivity detector, positioned in the effluent stream after it leaves the chamber. In this way, the removal of substances from the workpiece can be monitored, allowing control of the optimal extraction times, temperatures, and pressures.

An additional preferred mode of operation is to use a means downstream of the chamber to capture the substance(s) extracted from the surface of the workpiece, after which the $CO_2$ can be vented to exhaust or reused.

DETAILED DESCRIPTION—CONCLUSIONS, RAMIFICATIONS AND SCOPE

Skilled persons will appreciate that the apparatus of the present invention facilitates rapid processing of workpieces with supercritical fluids without the generation of harmful particulates and without the need of disassembly for routine maintenance on the chamber sealing means. It is anticipated that the novel improvements in the present invention will substantially reduce the time and expense of using supercritical $CO_2$ and other fluids to process workpieces under controlled temperatures and pressures.

We claim:

1. An apparatus for processing workpieces with gas(es) and/or fluid(s), comprising:

a pressurizable chamber having a fixed top and a removable stage for carrying one or more workpieces into said chamber, said stage comprising a bottom of said chamber;

an opening in the side of said chamber for introducing said stage; a stage raising means underneath the stage for raising said stage and pressing it against the fixed top to form a sealed processing space; heater systems for controlling the temperatures of the fixed top, the stage and the gas(es) and/or fluid(s) within the chamber; means for introducing pressurized gas(es) and/or fluid(s) to said closed processing space; exit means for exiting pressurized gas(es) and/or fluid(s) from the processing space.

2. An apparatus according to claim 1, further comprising a sonic means for rapidly altering pressure inside the chamber.

3. An apparatus according to claim 1, further comprising a piston means for rapidly altering pressure inside the chamber.

4. An apparatus according to claim 1, further comprising a removable elastic, plastic or metallic sealing means in the stage surface that contacts the fixed top.

5. An apparatus according to claim 1, wherein said stage raising means includes a mechanical or electromechanical system.

6. An apparatus according to claim 5, wherein said mechanical or electromechanical system is contained beneath the pressure chamber.

7. An apparatus according to claim 1, wherein said stage raising means includes a hydraulic system.

8. An apparatus according to claim 7, wherein said hydraulic system is contained beneath the pressure chamber.

9. An apparatus according to claim 1, further comprising an alignment means that guide the stage into a position on the stage raising means.

10. An apparatus according to claim 9, wherein said stage raising means includes a sensing and signaling means for sensing proper placement of the stage and signaling to allow or disallow chamber closure.

11. An apparatus according to claim 1, further comprising a system of ducts to distribute said gas(es) and/or fluid(s) within said pressure chamber.

12. An apparatus according to claim 1, wherein said process gas or fluid is carbon dioxide.

13. An apparatus according to claim 1, wherein said process gas or fluid includes methanol, ethanol, 2-propanol, or acetone.

14. An apparatus according to claim 1, further comprising a sensing means located in said exit means to analyze the composition of gas(es) and/or fluid(s) exiting from the processing space.

15. An apparatus according to claim 1, further comprising a heating means for controlling the temperature of processing gas(es) and/or fluid(s) prior to introduction into the chamber.

* * * * *